US012563758B2

(12) United States Patent
Pal et al.

(10) Patent No.: US 12,563,758 B2
(45) Date of Patent: Feb. 24, 2026

(54) TRANSISTOR FEEDBACK CAPACITANCE REDUCTION

(71) Applicant: MACOM Technology Solutions Holdings, Inc., Lowell, MA (US)

(72) Inventors: Debdas Pal, Acton, MA (US);
Parshant Kumar, Stoneham, MA (US);
Stephen Bilotta, Brookline, NH (US);
Timothy E. Boles, Tyngsboro, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 486 days.

(21) Appl. No.: 18/309,320

(22) Filed: Apr. 28, 2023

(65) Prior Publication Data

US 2024/0363742 A1 Oct. 31, 2024

(51) Int. Cl.
H10D 10/80 (2025.01)
H10D 62/10 (2025.01)

(52) U.S. Cl.
CPC ........... H10D 10/80 (2025.01); H10D 62/106 (2025.01)

(58) Field of Classification Search
CPC ......... H10D 10/021; H10D 10/80–891; H10D 64/20
See application file for complete search history.

(56) References Cited

U.S. PATENT DOCUMENTS 5,525,826 A * 6/1996 Palara .................. H10D 84/406
257/500
2022/0416062 A1* 12/2022 Kao ..................... H10D 62/136

* cited by examiner

*Primary Examiner* — Wasiul Haider
(74) *Attorney, Agent, or Firm* — Perilla Knox & Hildebrandt LLP; Jason M. Perilla

(57) ABSTRACT

The reduction of feedback capacitance in active semiconductor devices, such as the reduction in collector to base capacitance in transistors, is described. In one example, a transistor includes a substrate, an active region of the transistor in the substrate, a dielectric layer over a top surface of the substrate, and an interconnect region. The active region includes a base contact over the active region. The interconnect region includes a conductive interconnect that extends over the dielectric layer and is electrically coupled with the base contact. The interconnect region also includes a semiconductor junction region extending under the conductive interconnect in an area of the substrate outside of the active region. The addition of the semiconductor junction region under the conductive interconnect reduces the total collector to base capacitance in the transistor.

20 Claims, 9 Drawing Sheets

TRANSISTOR FEEDBACK CAPACITANCE REDUCTION

BACKGROUND

An amplifier is an electronic circuit or device designed to increase the power level of an input signal. Amplifiers are typically designed to have linear gain over at least a certain frequency range or bandwidth. Amplifiers can be defined according to the properties of their outputs to their inputs, among other characteristics. As one example, gain can be defined as the ratio between the magnitudes of output and input signals of an amplifier, and it can be unitless and expressed in decibels.

Transistors are commonly used as amplifiers. A transistor, such as a bipolar junction transistor, can be configured as a certain type or class of amplifier based on which terminal of the transistor is common to both the input and the output circuit. In the case of bipolar junction transistors, the amplifier classes include common emitter, common base, and common collector. For field-effect transistors, the amplifier classes include common source, common gate, and common drain.

SUMMARY

The reduction of feedback capacitance in active semiconductor devices, such as the reduction in collector to base capacitance in transistors, is described. In one example, a transistor includes a substrate, an active region of the transistor in the substrate, a dielectric layer over a top surface of the substrate, and an interconnect region. The active region includes a base contact over the active region. The interconnect region includes a conductive interconnect extending over the dielectric layer and being electrically coupled with the base contact and a semiconductor junction region extending under the conductive interconnect in an area of the substrate outside of the active region.

In one aspect, the conductive interconnect, the dielectric layer, and the substrate have a first capacitance, the semiconductor junction region under the conductive interconnect has a second capacitance, and the first capacitance is electrically coupled in series with the second capacitance. The first capacitance is within 50% of the second capacitance in some cases. In other aspects, the conductive interconnect includes a bond pad and an interconnect arm, and the semiconductor junction region extends under the bond pad and the interconnect arm.

In other examples, the transistor further includes a second dielectric layer under the conductive interconnect in an area of the substrate outside the active region. A thickness of the second dielectric layer is different than a thickness of the dielectric layer. In this example, the conductive interconnect, the dielectric layer, the second dielectric layer, and the substrate have a first capacitance, the semiconductor junction region under the conductive interconnect has a second capacitance, and the first capacitance is electrically coupled in series with the second capacitance.

In other examples, the transistor further includes a guard ring around the active region. The guard ring includes the semiconductor junction region and extends under the conductive interconnect in an area of the substrate outside of the active region. The semiconductor junction region is separated from the guard ring in one example. In other aspects, the active region further includes an emitter contact over the active region on a top side of the substrate, and a collector contact over a bottom side of the substrate.

In other examples, the transistor further includes a second active region of the transistor in the substrate, the second active region including a second base contact over the second active region, a second conductive interconnect extending over the dielectric layer and being electrically coupled with the second base contact, and a second semiconductor junction region extending under the second conductive interconnect in an area of the substrate outside of the active region and outside of the second active region.

In one example, the substrate includes an n-type substrate, and the semiconductor junction region includes a p-type dopant. In another example, the substrate includes an p-type substrate, and the semiconductor junction region includes a n-type dopant.

In another embodiment, a transistor includes a substrate, an active region of the transistor in the substrate, the active region including a guard ring and a base contact over the active region, a dielectric layer over a top surface of the substrate, and an interconnect region outside of the active region. The interconnect region includes a conductive interconnect extending over the dielectric layer and being electrically coupled with the base contact and a semiconductor junction region extending under the conductive interconnect.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

DETAILED DESCRIPTION

Figure 1:
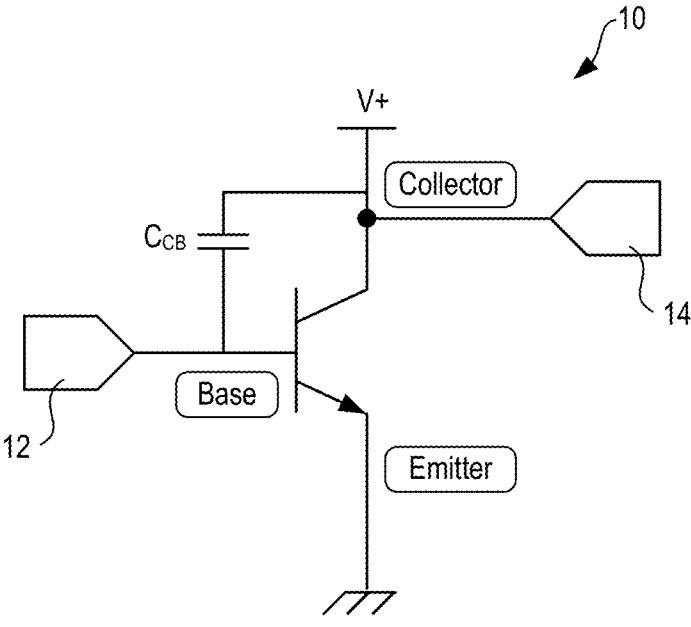
FIG. 1 illustrates an example transistor according to various embodiments described herein.

A transistor, such as a bipolar junction transistor (BJT), can be configured as a certain type or class of amplifier based on which terminal of the transistor is common to both the input and the output circuit. BJT amplifier classes include common emitter, common base, and common collector configurations. For field-effect transistors, the amplifier classes include common source, common gate, and common drain.

A heterojunction bipolar transistor (HBT) is one type of BJT that relies upon different semiconductor materials for the emitter and base regions. HBTs are often used to amplify signals of higher frequencies as compared to BJTs, such as radio frequency (RF) signals up to several hundred GHz. HBTs are often relied upon in applications for high power efficiency RF power amplification. As examples, BJTs and HBTs can be manufactured from semiconductor substrates and layers of semiconductor materials including the group IV elemental semiconductor materials, such as Silicon (Si) and Germanium (Ge), compounds thereof, and the group III elemental semiconductor materials, including Aluminum (Al), Gallium (Ga), and Indium (In), and compounds thereof.

In the high frequency operation of a BJT or HBT transistor configured as a common emitter, the device maximum current gain cutoff frequency ($f_T$), maximum oscillation frequency ($f_{MAX}$), RF gain, and overall frequency response are limited by the cutoff frequency of the feedback capacitance $C_{CB}$ from the collector (i.e., the output) to the base (i.e., the input) of the transistor. The total capacitance of $C_{CB}$ is determined by a combination of capacitances, including the active junction capacitance of the transistor between the collector and the base and other parasitic capacitances related to metal interconnects, bond pads, and related structures of the transistor. The embodiments described herein can be relied upon to tailor and effectively reduce the overall value of this feedback component by adding an additional junction capacitor in series with a capacitance attributed to the base bond pads and current redistribution metal interconnects of the transistor.

In the context outlined above, various approaches to reduce the feedback capacitance in active semiconductor devices, such as the reduction in collector to base capacitance in transistors, is described herein. In one example, a transistor includes a substrate, an active region of the transistor in the substrate, a dielectric layer over a top surface of the substrate, and an interconnect region. The active region includes a base contact over the active region. The interconnect region includes a conductive interconnect that extends over the dielectric layer and is electrically coupled with the base contact. The interconnect region also includes a semiconductor junction region extending under the conductive interconnect in an area of the substrate outside of the active region. The conductive interconnect, the dielectric layer, and the substrate comprise a first capacitance. The semiconductor junction region under the conductive interconnect comprises a second capacitance, and the first capacitance is electrically coupled in series with the second capacitance. The addition of the second capacitance in series with the first capacitance effectively reduces collector to base capacitance in the transistor.

Turning to the drawings, FIG. 1 illustrates an example transistor 10 according to various embodiments described herein. The transistor 10 can be embodied as a BJT, HBT, or another type of transistor. The transistor 10 is electrically connected in the common emitter configuration, with an input signal provided to the input 12 at the base of the transistor 10 and an output signal taken from the output 14 at the collector of the transistor 10. The emitter of the transistor 10 is coupled to ground in the example shown. The transistor 10 can be formed from a range of semiconductor materials. The concepts described herein are not limited to use with transistors of any particular type of semiconductor substrates or semiconductor material layers, as the concepts can be extended to a range of active devices implemented in a range of semiconductor materials. Thus, although particular examples are described herein, the concepts can be extended to use with a range of range of active devices implemented in a range of semiconductor materials The transistor 10 includes a capacitance $C_{CB}$ between the collector and the base. The $f_T$, $f_{MAX}$, RF gain, and overall frequency response of the transistor 10 are limited by the cutoff frequency of the capacitance $C_{CB}$. When the transistor 10 is electrically coupled in the common emitter configuration shown in FIG. 1, $C_{CB}$ is a feedback term and impacts the overall gain characteristics of the transistor 10. The total capacitance of $C_{CB}$ is determined by a combination of capacitances, including the active junction capacitance between the collector and the base in the transistor 10, as well as other parasitic capacitances related to metal interconnects, bond pads, and related structures of the transistor 10. For example, the total capacitance of $C_{CB}$ is also based, at least in part, on the metal-oxide-semiconductor (MOS) capacitances associated with metal interconnect, bond pad, and related conductive features of the transistor 10.

It can be difficult or impractical to alter the total capacitance of $C_{CB}$ by reducing the active junction capacitance of the transistor 10, particularly for high power applications where the transistor 10 is designed to have a minimum active junction size. Additionally, while the MOS capacitance associated with metal interconnects, bond pads, and related features of the transistor 10 can be altered to some extent, the current handling capacity of such metal features should also be maintained to support the power handling capabilities of the transistor 10 for high power applications. Contributing factors related to the total $C_{CB}$ capacitance between the collector and the base in transistors are described in additional detail below.

Figure 2:
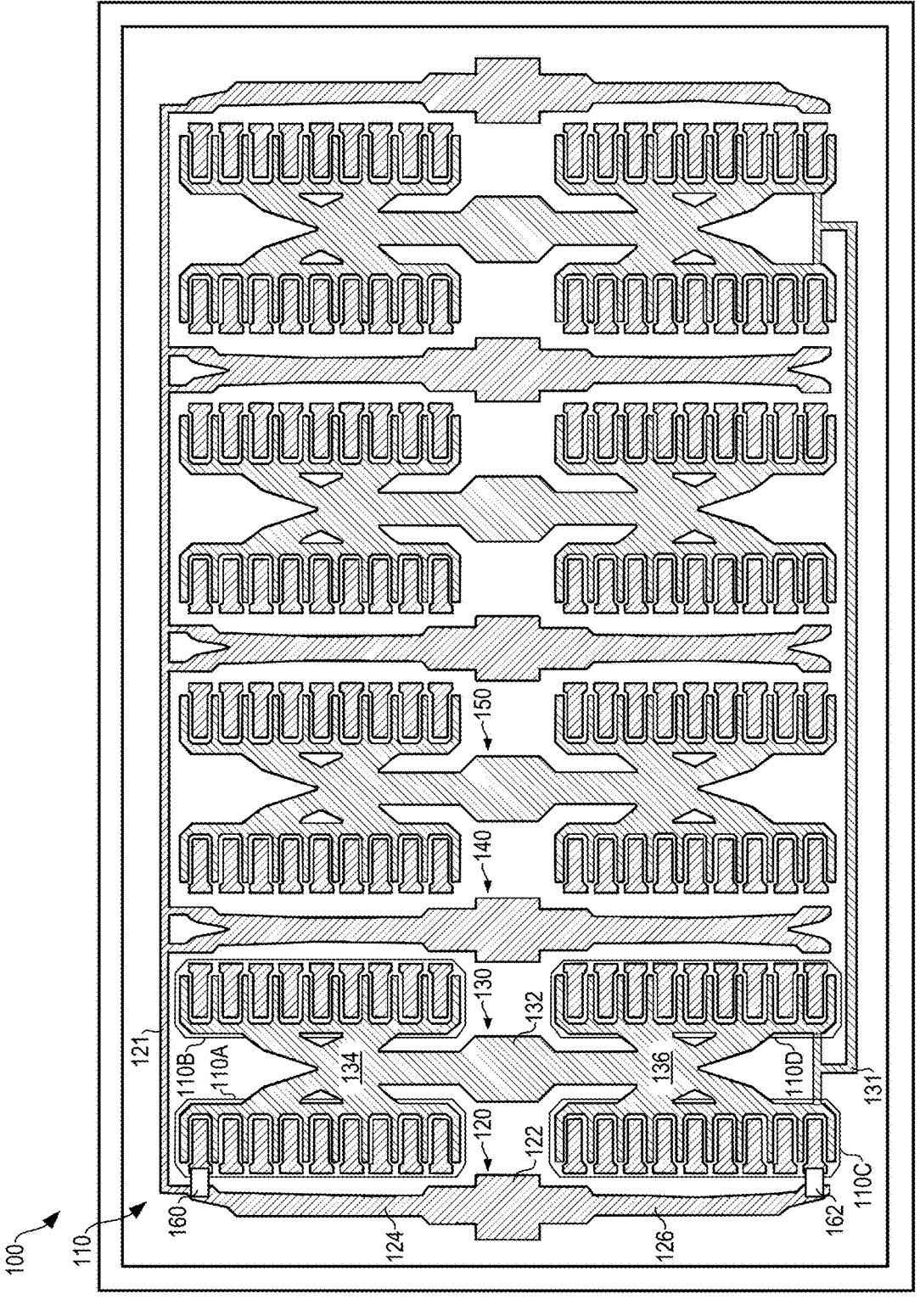
FIG. 2 illustrates an example die according to various embodiments described herein.
Figure 3:
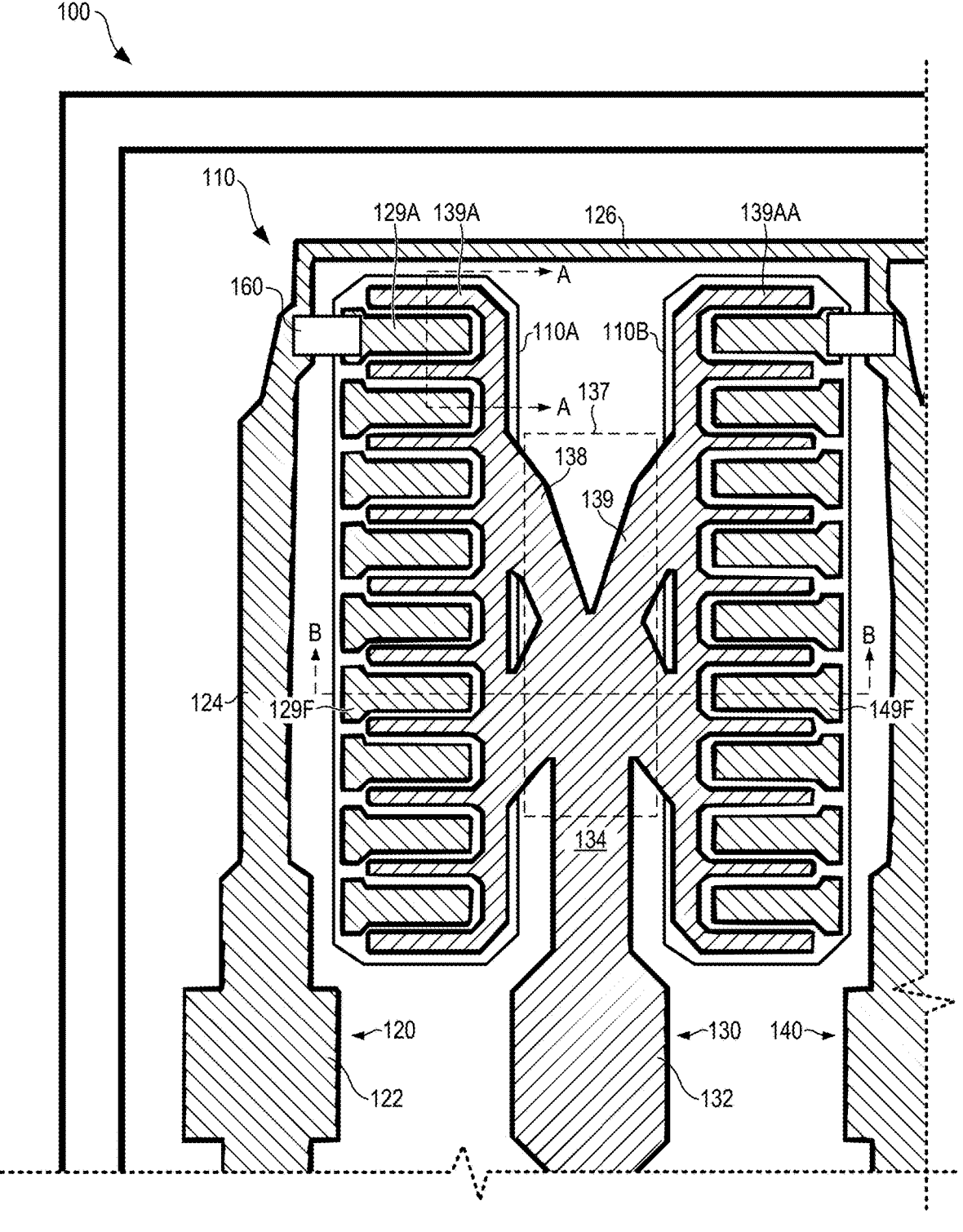
FIG. 3 illustrates a portion of the die shown in FIG. 2 according to various embodiments described herein.

FIG. 2 illustrates an example die 100 according to various embodiments described herein. FIG. 3 illustrates a portion of the die 100 shown in FIG. 2. FIGS. 2 and 3 are top-down views of the top side of the die 100. An integrated transistor 110 is implemented on the die 100. The transistor 110 is a BJT transistor in the example shown and is one example of the transistor 10 shown in FIG. 1. The die 100 and the transistor 110 are shown as a representative example. The features of the transistor 110, such as the active region, contacts, interconnects, and other features of the transistor 110, are not drawn to any particular scale. The shapes, positions, orientations, and other characteristics of the active region, contacts, interconnects, and other features of the transistor 110 can vary as compared to that shown. For simplicity, some features of the transistor 110 are omitted from view in FIGS. 2 and 3, such as resistors, guard rings, active areas, regions in which dopants are implanted, and other features. The concepts described herein, in any case, are not limited to use with transistors of any particular type or arrangement, and the transistor 110 is provided as a representative example to convey the concepts. For example, while the transistor 110 is an "npn" type transistor, the concepts can be extended to and include "pnp" type transistors. The concepts are also not limited to use with transistors, as the concepts can be applied in other types of active semiconductor devices.

As described in further detail below, the die 100 includes a semiconductor substrate, one or more dielectric insulating layers over the substrate, and one or more metal layers over the dielectric insulating layers, among other layers and structures. Among other features, the die 100 can include a semiconductor substrate, one or more epitaxial layers of semiconductor materials over a top surface of the semiconductor substrate, one or more dielectric insulating layers over the epitaxial layers, and one or more metal layers over the dielectric insulating layers. The semiconductor substrate and the epitaxial layers, where epitaxial layers are relied upon, can be embodied as Silicon, in one example, although other group III-IV semiconductor materials can be used. Reference to a semiconductor substrate, as used herein, can refer both to a substrate or underlying carrier as well as one or more epitaxial layers over the substrate in some cases. The semiconductor substrate, the epitaxial layers, or both can be doped with n-type or p-type dopants, depending on the type and arrangement of the junctions in the transistor 110. The semiconductor substrate, the epitaxial layers, or both can also include one or more regions in which n-type and p-type dopants are implanted, as well as junctions between the doped regions and the surrounding semiconductor layers in the transistor 110.

Referring to FIG. 2, the transistor 110 includes a number of active areas. In the example shown, the active areas of the transistor 110 are positioned within guard rings 110A-110D, among others. The guard rings 110A-110D are doped regions in the transistor 110 and help to increase the breakdown voltage of the transistor 110. The base to emitter junctions of the transistor 110 are formed within the guard rings 110A-110D, as described in further detail below. Base and emitter contacts of the transistor 110 are also formed over the active areas within the guard rings 110A-110D. The base and emitter contacts of the transistor 110 are formed as interdigitated base and emitter contact fingers in the example shown. The collector of the transistor 110 is formed, in part, by the underlying substrate of the transistor 110 in the regions under the active areas. A collector contact (not shown in FIG. 2) for the transistor 110 is positioned over a bottom side of the substrate of the transistor 110 as described below. Additional details related to the base, emitter, and collector regions of the transistor 110 and the junctions between them are described below with reference to FIG. 4.

The transistor 110 includes a number of conductive interconnects. The conductive interconnects are formed outside of the active areas of the transistor and, in some cases, extend over and contact semiconductor materials in the active regions. For example, the transistor 110 includes conductive interconnects 120, 130, 140, and 150, among others. The interconnects 120, 130, 140, and 150 can be embodied as conductive layers or traces of metal that are patterned and deposited over the die 100. The interconnects 120, 130, 140, and 150 serve as electrical interconnects between and contacts for interfacing with the terminals of the transistor 110. The interconnects 120 and 140 are interconnects for the emitter terminal of the transistor 110 (also "emitter interconnects 120 and 140"). The interconnects 130 and 150 are interconnects for the base terminal of the transistor 110 (also "base interconnects 130 and 150"). The emitter interconnect 120 includes an emitter bond pad 122, emitter interconnect arms 124 and 126, and an emitter interconnect tie bar 121. The base interconnect 130 includes a base bond pad 132, base interconnect arms 134 and 136, and a base interconnect tie bar 131. The emitter interconnect 140 is similar to the emitter interconnect 120, and the base interconnect 150 is similar to the base interconnect 130. As shown in FIG. 2, the transistor 110 also includes additional conductive interconnects that are not individually referenced.

The emitter bond pad 122 is embodied as a metal pad suitable in size and shape for the electrical connection of a bond wire to the die 100 and the transistor 110. Similarly, the base bond pad 132 is embodied as a metal pad suitable in size and shape for the electrical connection of a bond wire to the die 100. The size, shape, and positions of the emitter bond pad 122 and the base bond pad 132, among others, can vary as compared to that shown.

The emitter interconnect 124 is electrically coupled with and extends away from one side of the emitter bond pad 122. The emitter interconnect 124 extends laterally along edges of emitter contact fingers that are positioned over the active region within the guard ring 110A. A resistor 160, which can be embodied as a diffused bulk resistor, a thin film resistor, or another type of resistor, is positioned and electrically coupled between the emitter interconnect 124 and one of the emitter contact fingers over the active region within the guard ring 110A. As one example, the resistor 160 can be formed as a bulk resistor, through implanted or diffused dopants, or in other ways. Alternatively, the resistor 160 can also be formed as a thin film resistor using nichrome, tantalum nitride, tungsten silicide, or other suitable materials.

The emitter interconnect 126 is also electrically coupled with and extends away from another side of the emitter bond pad 122. The emitter interconnect 126 extends laterally along edges of the emitter contact fingers that are positioned over the active region within the guard ring 110B. A resistor 162, similar to the resistor 160, is electrically coupled between the emitter interconnect 126 and one of the emitter contact fingers over the active region within the guard ring 110B. Although not shown in FIG. 2, the transistor 110 can include additional resistors that are electrically coupled between one or more of the emitter contact fingers and the emitter interconnects 124 and 126.

The base interconnect arm 134 is electrically coupled with and extends away from one side of the base bond pad 132. The base interconnect arm 134 extends laterally along and is electrically coupled to (and is integral with) the base contact fingers that are positioned and extend over the active region within the guard ring 110A. The base interconnect arm 134 also extends laterally along and is electrically coupled to the base contact fingers that are positioned and extend over the active region within the guard ring 110B. As described in further detail below with reference to FIG. 3, the base interconnect arm 134 includes an interconnect manifold between the guard rings 110A and 110B. The manifold extends to the base contact fingers in both the active regions within the guard rings 110A and 110B.

The base interconnect arm 136 is electrically coupled with and extends away from another side of the base bond pad 132. The base interconnect arm 136 extends laterally along and is electrically coupled to the base contact fingers over the active region within the guard ring 110C. The base interconnect arm 136 also extends laterally along and is electrically coupled to the base contact fingers over the active region within the guard ring 110D. The base interconnect arm 136 also includes a base interconnect manifold between the guard rings 110C and 110D.

Referring to FIG. 3, the base interconnect arm 134 includes a base interconnect manifold 137 between the guard rings 110A and 110B. The base interconnect manifold 137 includes manifold fingers, such as the manifold fingers 138 and 139, that extend to the base contact fingers 139A and 139AA, among others. The base interconnect arm 136 also includes a base interconnect manifold as shown in FIG. 2. As also shown in FIG. 3, a number of emitter contact fingers extend over the active areas within the guard rings 110A and 110B. Emitter contact fingers 129A, 129F, and 149F are individually referenced in FIG. 3.

The conductive interconnects 120, 130, 140, and 150, among others, can be embodied as Gold, Copper, Aluminum, other metallic and conductive materials, and alloys thereof. Although not shown in FIG. 3, the transistor 110 also includes one or more dielectric insulating layers, and the conductive interconnects 120, 130, 140, and 150 are formed, at least in part, over the dielectric insulating layer or layers. The dielectric insulating layers are described below with reference to FIGS. 4 and 5. The conductive interconnects 120, 130, 140, and 150, the intermediary dielectric insulating layer or layers below the interconnects, and the semiconductor materials of the transistor 110 under the interconnects form MOS capacitors. The resulting MOS capacitance of the interconnects, and particularly the MOS capacitance attributed to the base interconnects 130 and 150, forms a component of the overall $C_{CB}$ capacitance of the transistor 110.

Similar to the transistor 10 shown in FIG. 1, the transistor 110 includes a capacitance $C_{CB}$ between the collector and the base of the transistor 110. The $f_T$, $f_{MAX}$, RF gain, and overall frequency response of the transistor 110 are limited by the cutoff frequency of the capacitance $C_{CB}$. When the transistor 110 is electrically coupled in the common emitter configuration, $C_{CB}$ is a feedback term and impacts the overall gain characteristics of the transistor 110. The total capacitance of $C_{CB}$ is determined by a combination of capacitances, including the active junction capacitance between the collector and the base in the active regions of the transistor 110, as well as other parasitic capacitances related to metal interconnects, bond pads, and related structures of the transistor 110. Thus, the total $C_{CB}$ capacitance of the transistor 110 is based in part on the MOS capacitance attributed to the base interconnects 130 and 150, among other base interconnects.

It can be difficult or impractical to minimize the total capacitance of $C_{CB}$ by reducing the active junction capacitance in the active regions of the transistor 110, particularly for high power applications where the transistor 110 is designed to have a minimum active junction size. The MOS capacitance associated with the base interconnects 130 and 150 of the transistor 110, among others, can be tailored and reduced to some extent. For example, the trace widths and lengths of the base interconnects 130 and 150 and the distribution manifolds (e.g., the area of the base interconnect manifold 137 identified in FIG. 3) can be reduced to the extent practical. However, the current handling capacity of the base interconnects 130 and 150 should be maintained (e.g., to within a minimum size) to support the power handling capabilities and other design parameters of the transistor 110. The areas of the associated bond pads (e.g., the area of the bond pad 132) of the base interconnects 130 and 150 should also be maintained to a minimum size based on design rules. Additionally, the thickness (or thinness) of the dielectric layer under the base interconnects 130 and 150, which is not shown in FIG. 2 or 3, can be tailored but is also limited by design concerns.

As further detailed below, the concepts described herein include the addition of one or more semiconductor junction regions formed under one or more of the base interconnects 130 and 150, among other base interconnects, in regions of the die 100 outside of the active areas of the transistor 110. Examples of semiconductor junction regions formed under the base interconnect 130 are described below, and similar semiconductor junction regions can be formed under other base interconnects. In some cases, semiconductor junction regions can also be formed under other interconnects, including the emitter interconnects 120 and 140. The junction capacitances of the semiconductor junction regions are electrically coupled in series with the MOS capacitances of the base interconnects. When formed under the base interconnects 130 and 150, for example, the addition of the junction capacitances effectively reduces the total $C_{CB}$ capacitance of the transistor 110.

Figure 4:
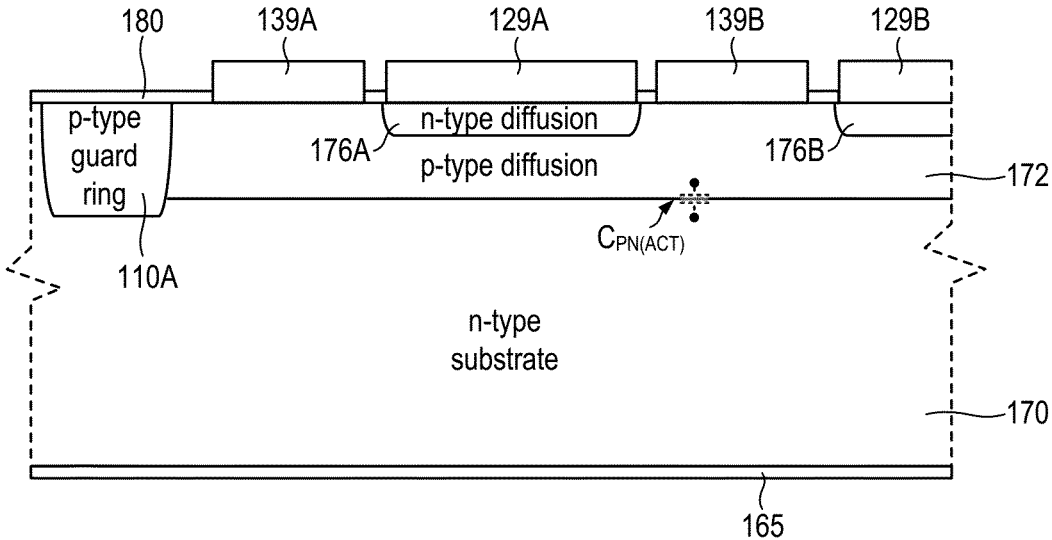
FIG. 4 illustrates the cross-sectional view designated A-A in FIG. 3 according to various embodiments described herein.

FIG. 4 illustrates the cross-sectional view designated A-A in FIG. 3. The cross-sectional view shown in FIG. 4 is taken within an active region of the transistor 110. The arrangement of the diffusion regions, the contacts, and other features of the active region of the transistor 110 is provided as a representative example. FIG. 4 illustrates a collector contact 165, an n-type substrate 170 (also "substrate 170"), the p-type guard ring 110A, a p-type diffusion region 172 (also "p-type region 172" or "region 172"), n-type diffusion regions 176A and 176B (also "n-type regions 176A and 176B" or "regions 176A and 176B"), and emitter contact fingers 129A and 129B (also "fingers 129A and 129B"), base contact fingers 139A and 139B (also "fingers 139A and 139B"). The base-to-emitter junction of the transistor 110 is formed, in part, between the n-type diffusion regions 176A and 176B and the p-type diffusion region 172. The base-to-collector junction of the transistor 110 is formed, in part, between the p-type diffusion region 172 and the n-type substrate 170. The collector contact 165 includes one or more layers of metal deposited on a bottom surface of the substrate 170. The collector contact 165 can be embodied as Gold, Copper, Aluminum, alloys including Aluminum, Copper, and other metals, and other metallic and conductive materials.

The substrate 170 can be embodied as a semiconductor substrate in one example. The substrate 170 forms the collector of the transistor 110. The substrate 170 can also be embodied as a semiconductor substrate (e.g., a carrier or handle substrate) and one or more epitaxial layers of semiconductor materials (not individually shown) over the semiconductor substrate. The substrate 170 and the epitaxial layers, where epitaxial layers are relied upon, can be embodied as Silicon, in one example, although other group III-IV semiconductor materials can be used. The substrate 170 can be n-type doped with phosphorus, for example, to a concentration of within the range of $10^{15\text{-}16}$ cm$^{-3}$, although other concentrations can be relied upon. The substrate 170 can include other n-type dopants in some cases, such as Arsenic or Antimony. Where the substrate 170 is embodied as a carrier substrate and one or more epitaxial layers of semiconductor materials over the carrier substrate, the carrier substrate can be n-type doped to a concentration of about $10^{19}$ cm$^{-3}$, for example, or within a range of between $10^{17\text{-}19}$ cm$^{-3}$, and the epitaxial layers can be doped to other concentrations within the range of $10^{14\text{-}16}$ cm$^{-3}$.

The p-type guard ring 110A is a ring-type region of p-type dopant that has been implanted into the top surface of the substrate 170. The guard ring 110A can be defined in shape and size using photolithographic patterning of a thin film (e.g., a photoresist film), the selective etching or removal of regions of the film, and p-type dopant implantation operations, as described in further detail below. The p-type dopant of the guard ring 110A can also be diffused into the substrate 170 after implantation. The guard ring 110A forms a boundary of one of the active regions of the transistor 110 and increases the breakdown voltage of the transistor 110. Measured from a top surface of the substrate 170, the p-type dopant in the guard ring 110A can be implanted and diffused to a depth that is deeper than the p-type dopant in the region 172. The p-type guard ring 110A can be formed by the implantation of boron, for example, although gallium or other p-type dopants can be relied upon. The concentration of the p-type dopant in the guard ring 110A can be about $10^{19}$ cm$^{-3}$, for example, or within the range of $10^{18\text{-}20}$ cm$^{-3}$, and other concentrations can be relied upon. In some cases, the guard rings described herein, such as the guard rings 11A-110D, may be omitted or not included in some embodiments. In that case, the active region of the transistor 110 would be defined by the area of the p-type diffusion region 172.

The p-type diffusion region 172 is bounded by the p-type guard ring 110A and forms a base region of the transistor 110. The region 172 includes a p-type dopant that has been implanted into the top surface of the substrate 170. The region 172 can be defined in shape and size using photolithographic patterning of a thin film, the selective etching or removal of regions of the film, and p-type dopant implantation operations. The p-type dopant in the region 172 can also be diffused into the substrate 170 after implantation. The region 172 forms, in part, the base of transistor 110. Measured from a top surface of the substrate 170, the p-type dopant in the region 172 can be implanted and diffused to a depth that less than the p-type dopant in the guard ring 110A. The region 172 can be formed by the implantation of boron, for example, although gallium or other p-type dopants can be relied upon. The concentration of the p-type dopant in the region 172 can be about $10^{17}$ cm$^{-3}$, for example, or within the range of $10^{17\text{-}19}$ cm$^{-3}$, and other concentrations can be relied upon.

The junction between the n-type doped substrate 170 and p-type diffusion region 172, as well as the junction between n-type doped substrate 170 and the p-type guard ring 110A, forms part of the active junction capacitance $C_{PN(ACT)}$ of the transistor 110. $C_{PN(ACT)}$ forms part of the total $C_{CB}$ capacitance of the transistor 110, along with other parasitic capacitances related to metal interconnects, bond pads, and related structures of the transistor 110.

The n-type diffusion regions 176A and 176B are formed within the p-type diffusion region 172 and the guard ring 110A. The regions 176A and 176B include an n-type dopant that has been implanted into the substrate 170. The regions 176A and 176B can be defined in shape and size using photolithographic patterning of a thin film, the selective etching or removal of regions of the film, and n-type dopant implantation operations. The n-type dopant in the regions 176A and 176B can also be diffused into the substrate 170 after implantation in some cases. The regions 176A and 176B form, in part, the emitter of the transistor 110. The regions 176A and 176B can be formed by the implantation of phosphorus, for example, although other n-type dopants can be relied upon. The concentration of the n-type dopant in the regions 176A and 176B can be within the range of $10^{15\text{-}16}$ cm$^{-3}$, for example, although other concentrations can be relied upon.

The dielectric layer 180 can be embodied as an insulating layer of Silicon dioxide ($SiO_2$), for example, among other suitable types of dielectric material layers. The dielectric layer 180 can be formed by the local oxidation of the top surface of the substrate 170, for example, or using other techniques. The emitter contact fingers 129A and 129B and the base contact fingers 139A and 139B are formed through openings in the dielectric layer 180. The openings in the dielectric layer 180 can be formed through photolithography and etching as described below. The emitter contact fingers 129A and 129B are positioned over and contact top surfaces of the n-type regions 176A and 176B, and the base contact fingers 139A and 139B are positioned over and contact top surfaces of the p-type region 172. The contact fingers 129A, 129B, 139A, and 139B can be embodied as Gold, Copper, Aluminum, other metallic and conductive materials, and alloys thereof.

Figure 5:
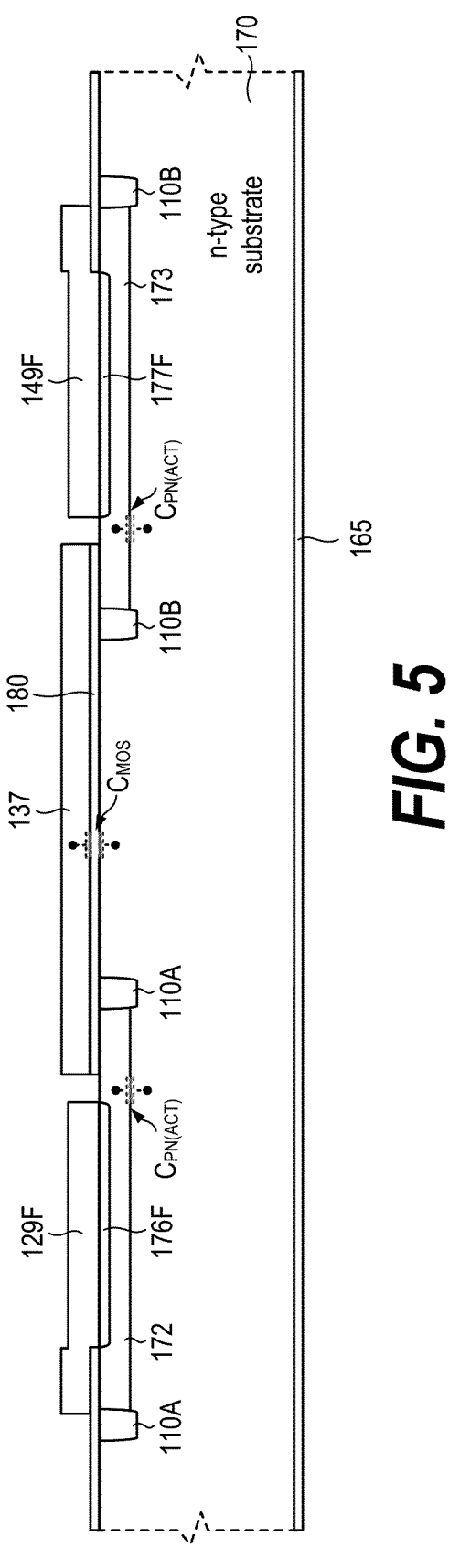
FIG. 5 illustrates the cross-sectional view designated B-B in FIG. 3 according to various embodiments described herein.

Turning to another view, FIG. 5 illustrates the cross-sectional view designated B-B in FIG. 3. FIG. 5 illustrates the collector contact 165, the substrate 170, the p-type guard rings 110A and 110B, the p-type region 172 within the p-type guard ring 110A, a p-type region 173 within the p-type guard ring 110B, the emitter contact fingers 129F and 149F, the dielectric layer 180, and the base interconnect manifold 137. The p-type region 173 is similar to the p-type region 172, and the emitter contact finger 149F is similar to the emitter contact finger 129F. In the cross-sectional view shown, the base interconnect manifold 137 is positioned between the p-type guard rings 110A and 110B and the p-type regions 172 and 173.

The base interconnect manifold 137 forms part of a MOS capacitance $C_{MOS}$. Particularly, $C_{MOS}$ is formed between the metal of the base interconnect manifold 137 and the n-type substrate 170, with the intervening dielectric layer 180 acting as an insulator between them. The $C_{MOS}$ capacitance is one component of the overall $C_{CB}$ capacitance of the transistor 110. Additionally, the junction between the n-type doped substrate 170 and p-type diffusion region 172, the junction between n-type doped substrate 170 and the p-type guard ring 110A, the junction between the n-type doped substrate 170 and p-type diffusion region 173, and the junction between n-type doped substrate 170 and the p-type guard ring 110B contribute to the active junction capacitance $C_{PN(ACT)}$ of the transistor 110. $C_{PN(ACT)}$ forms part of the total $C_{CB}$ capacitance of the transistor 110, along with $C_{MOS}$. As discussed above, $C_{CB}$ is a feedback term and impacts the overall gain characteristics of the transistor 110, particularly when the transistor 110 is electrically coupled in a common emitter configuration.

The $C_{MOS}$ capacitance formed by the base interconnect manifold 137, as shown in FIG. 5, is only part of the total $C_{MOS}$ capacitance formed by the base interconnects in the transistor 110. Referring again to FIG. 2, the total $C_{MOS}$ capacitance is attributed to the base interconnect 130, the base interconnect 150, and other metal layers that form base interconnects for the transistor 110. It can be difficult or impractical to minimize the total $C_{MOS}$ capacitance associated with the base interconnects in the transistor 110. The base interconnects 130 and 150, among others, can be minimized or tailored to some extent. For example, the trace widths and lengths of the base interconnects 130 and 150 can be reduced to the extent possible but should also be maintained to a minimum size based on design parameters, the overall dimensions of the transistor 110, and related factors. Additionally, the thickness (or thinness) of the dielectric layer 180 under the base interconnects 130 and 150, as shown in FIG. 5, can be tailored but is also limited by design concerns.

Figure 6:
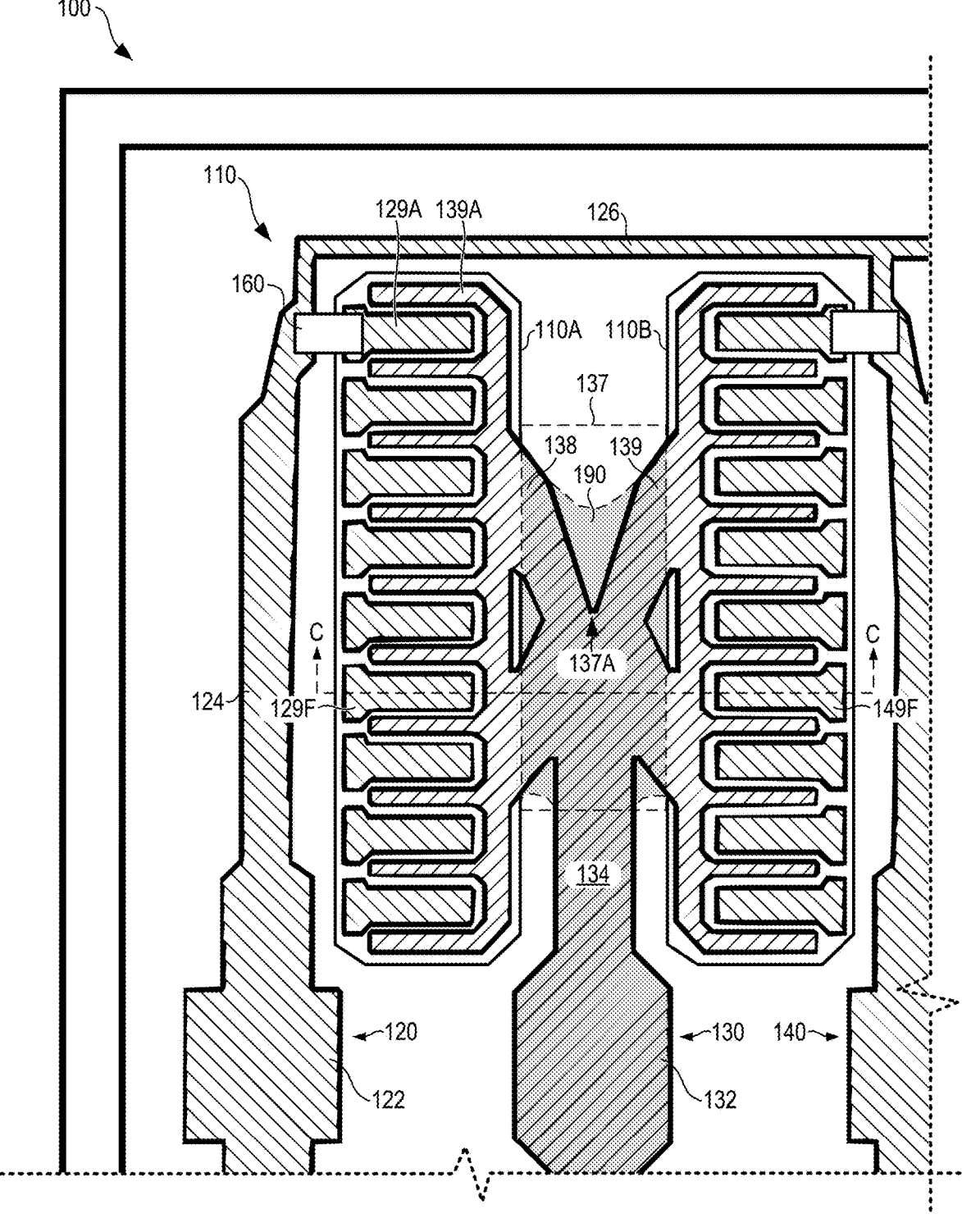
FIG. 6 illustrates the portion of the die shown in FIG. 3 with the addition of a junction capacitance according to various embodiments described herein.

According to aspects of the embodiments described herein, the contribution of the $C_{MOS}$ capacitance attributed to the base interconnects 130 and 150 of the transistor 110 to the total $C_{CB}$ capacitance of the transistor 110 is effectively reduced through the addition of a semiconductor junction region formed under the base interconnects 130 and 150. The additional semiconductor junction region under the base interconnects 130 and 150 is positioned outside of the active regions of the transistor 110. FIG. 6 illustrates the portion of the die 100 shown in FIG. 3 with the addition of a junction capacitance according to various embodiments described herein. In FIG. 6, a p-type region 190 is formed under the base interconnect 130. The p-type region 190 is formed under the base bond pad 132, the base interconnect arm 134, and the base interconnect manifold 137 in the example shown. Although not shown in FIG. 6, the p-type region 190 also extends under the base interconnect arm 136 (see FIG. 2). Additionally, another p-type region similar to the p-type region 190 can be formed under the base interconnect 150 (see FIG. 2) and under other base interconnects of the transistor 110. The p-type region 190 can also be formed under the base interconnect tie bar 131 (see FIG. 2) in some cases.

The p-type region 190 can be formed by the implantation of boron, for example, into a region of the top surface of the substrate 170 before the base interconnect 130 is deposited or otherwise formed over it. Other p-type dopants can also be relied upon to form the p-type region 190. The p-type region 190 is formed and located under the base interconnect 130 in the example shown in FIG. 6. The size, shape, and position of the p-type region 190 can be defined through photolithography as described in further detail below. In some cases, the peripheral boundary of p-type region 190, as measured across the top of the transistor 110 and shown in FIG. 6, can be the same as that of the base interconnect 130. In other examples, the p-type region 190 can be formed to have a peripheral boundary that is smaller than the peripheral boundary of the base interconnect 130. These and other examples are described below with reference to FIG. 7.

The p-type region 190 can also extend, in part, beyond the peripheral boundary of the base interconnect 130 in some cases. For example, the p-type region 190 shown in FIG. 6 is larger than the base interconnect manifold 137 and extends between the manifold fingers 138 and 139. Overall, while the base interconnect manifold 137 may include some relatively sharp corners or edges (e.g., such as the corner 137A), the p-type region 190 can be formed to have a peripheral boundary with only rounded corners or edges and without any sharp corners or edges. The use of rounded corners can help to preserve the breakdown voltage associated with the p-type region 190. In other examples, the base interconnect 130 can be formed to have a peripheral boundary that coincides with that of the p-type region 190. In that case, the base interconnect 130 can also be formed to omit sharp corners or edges.

The concentration of the p-type dopant in the p-type region 190 can be chosen or selected to tailor the capacitance associated with the p-type region 190. Particularly, the concentration of the p-type dopant can be selected to tailor the junction capacitance (e.g., the depletion region capacitance) between the p-type region 190 and the surrounding n-type substrate 170 in which it is formed. The concentration of the p-type dopant in the p-type region 190 can be about $10^{19}$ cm$^{-3}$, for example, or within the range of $10^{18-20}$ cm$^{-3}$, and other concentrations can be relied upon. In one example, the concentration of the p-type dopant in the p-type region 190 is the same as (or not intentionally different than) the concentration of the p-type dopant in the guard rings 110A and 110B at about $10^{19}$ cm$^{-3}$. In other cases, the concentration of the p-type dopant in the p-type region 190 can be different than (i.e., intentionally greater or less than) the concentration of the p-type dopant in the guard rings 110A and 110B. For example, the concentration of the p-type dopant in the p-type region 190 can be about $10^{18}$ cm$^{-3}$ or lower and the concentration of the p-type dopant in the guard rings 110A and 110B can be about $10^{19}$ cm$^{-3}$ or higher. As another example, the concentration of the p-type dopant in the p-type region 190 can be about $10^{17}$ cm$^{-3}$ or lower and the concentration of the p-type dopant in the guard rings 110A and 110B can be about $10^{18}$ cm$^{-3}$ or higher. In other cases, the concentration of the p-type dopant in the p-type region 190 can be about $10^{20}$ cm$^{-3}$ and the concentration of the p-type dopant in the guard rings 110A and 110B can be about $10^{19}$ cm$^{-3}$.

Figure 7:
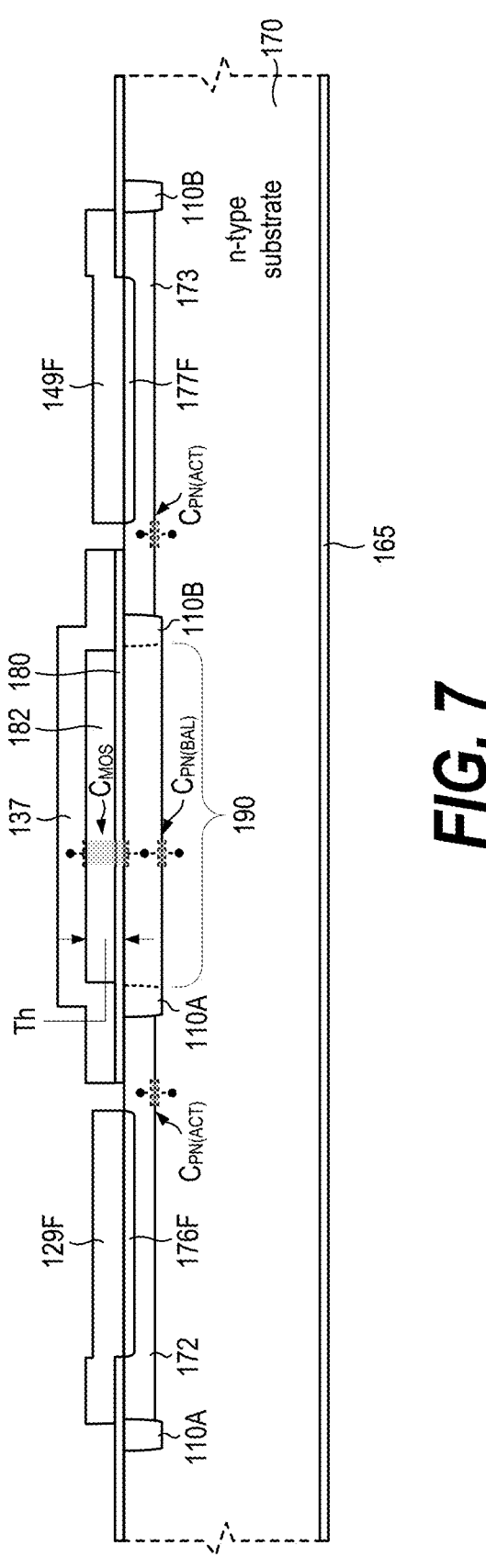
FIG. 7 illustrates the cross-sectional view designated C-C in FIG. 6 according to various embodiments described herein.

FIG. 7 illustrates the cross-sectional view designated C-C in FIG. 6. Similar to FIG. 5, FIG. 7 illustrates the collector contact 165, the substrate 170, the p-type guard rings 110A and 110B, the p-type region 172 within the p-type guard ring 110A, a p-type region 173 within the p-type guard ring 110B, emitter contact fingers 129F and 149F, the dielectric layer 180, and the base interconnect manifold 137. FIG. 7 also illustrates a cross-section of the p-type region 190. The p-type region 190 is positioned under the base interconnect manifold 137 and extends between the guard rings 110A and 110B. In addition to the dielectric layer 180, FIG. 7 also illustrates a dielectric layer 182 in the example shown. The dielectric layer 182 can be embodied as an insulating layer of SiO$_2$, for example, among other types of dielectric material layers. The dielectric layer 182 can also be omitted in some cases.

Similar to the example described above in FIG. 5, the base interconnect manifold 137 forms part of the MOS capacitance $C_{MOS}$. Particularly, the $C_{MOS}$ capacitance is formed between the base interconnect manifold 137 and the p-type region 190, with the intervening dielectric layers 180 and 182 acting as an insulator between them. Additionally, a junction capacitance $C_{PN(BAL)}$ is present between the n-type substrate 170 and the p-type region 190 under the manifold 137. The junction capacitance $C_{PN(BAL)}$ is a combination of a barrier or transition capacitance and a diffusion capacitance associated with the p-type region 190, the n-type substrate 170, and the junction between them. The junction capacitance $C_{PN(BAL)}$ is electrically connected in series with the $C_{MOS}$ capacitance, as shown in FIG. 7. For capacitors in series, the total capacitance $C_{Tot}$ is found by adding the reciprocals of the individual capacitances $C_1$, $C_2$, $C_3$, etc. and taking the reciprocal of the sum. Thus, for the series combination of $C_{PN(BAL)}$ and $C_{MOS}$ in FIG. 7, the total capacitance $C_{Tot}$ can be found as follows:

$$\frac{1}{C_{Tot}} = \frac{1}{C_{PN(BAL)}} + \frac{1}{C_{MOS}}.$$

In the series combination, the addition of $C_{PN(BAL)}$ effectively reduces the capacitance of $C_{MOS}$, as $C_{Tot}$ is always less than $C_{MOS}$ for any $C_{PN(BAL)}$ greater than 0. For that reason, the junction capacitance $C_{PN(BAL)}$ can also be referred to as a balancing capacitance of the $C_{MOS}$ capacitance. If $C_{PN(BAL)}$ is equivalent to $C_{MOS}$, the capacitance of $C_{MOS}$ is reduced by a factor of 2. A reduced $C_{Tot}$ capacitance, as compared to a relatively larger $C_{MOS}$ capacitance, contributes to a lower $C_{CB}$ for the transistor 110 and improved $f_T$, $f_{MAX}$, RF gain, and overall frequency response and gain characteristics of the transistor 110.

As noted above, the $C_{Tot}$ capacitance can be as low as $\frac{1}{2}$ of the total $C_{MOS}$ capacitance if $C_{PN(BAL)}$ is equivalent to $C_{MOS}$. Among other aspects, each of the size, shape, depth, and dopant concentration of the p-type region 190 can be individually tailored to set the $C_{PN(BAL)}$ capacitance. Those aspects can be tailored to make the $C_{PN(BAL)}$ capacitance equivalent to (or approach equivalency with) $C_{MOS}$. Further, the $C_{MOS}$ capacitance can also be tailored for equivalency with $C_{PN(BAL)}$. For example, without changing the size of the base interconnect 130 or the thickness of the dielectric layer 180, each of the size, shape, position, and thickness of the dielectric layer 182 can be individually tailored to set the $C_{MOS}$ capacitance. Examples of those variations are described below with reference to FIG. 8.

In the example shown in FIG. 7, the p-type region 190 is formed as an extension of the guard rings 110A and 110B. In other words, the p-type region 190 is an extension of and can be formed in the same process steps used to form the guard rings 110A and 110B. In that case, the dopant concentration in the p-type region 190 can be the same as that in the guard rings 110A and 110B. The guard rings 110A and 110B define (e.g., bound) active regions of the transistor 110, as described above. The p-type region 190 extends under the base interconnect manifold 137 in an area of the substrate 170 that is beyond or outside of the active regions. Further, as shown in FIG. 2, the p-type region 190 extends under the entire base interconnect 130 outside of the active regions, including under the base bond pad 132 and under the base interconnect arms 134 and 136. In other examples, such as that shown in FIG. 8, the p-type region 190 can extend under a portion or range of the area under the base interconnect 130.

The dielectric layer 182 is formed under the base interconnect manifold 137, over the dielectric layer 180, and over the p-type region 190 in the example shown in FIG. 7. More particularly, the dielectric layer 182 is formed over the p-type region 190 in an area of the substrate 170 that is beyond or outside of the active regions of the transistor 110. The dielectric layer 182 can be formed under the entire base interconnect 130 outside of the active regions. In other examples, such as that shown in FIG. 8, the dielectric layer 182 can extend under a portion or range of the area under the base interconnect 130. The thickness "Th" of the dielectric layer 182 can be selected to tailor the $C_{MOS}$ capacitance associated with the base interconnect 130, separately from the thickness of the dielectric layer 180. For example, the thickness "Th" of the dielectric layer 182, as measured from the top to the bottom of the page in the cross-sectional view shown in FIG. 7, can be thicker than the thickness of the dielectric layer 180. Alternatively, the thickness "Th" of the dielectric layer 182 can be the same as or thinner than the thickness of the dielectric layer 180.

Figure 8:
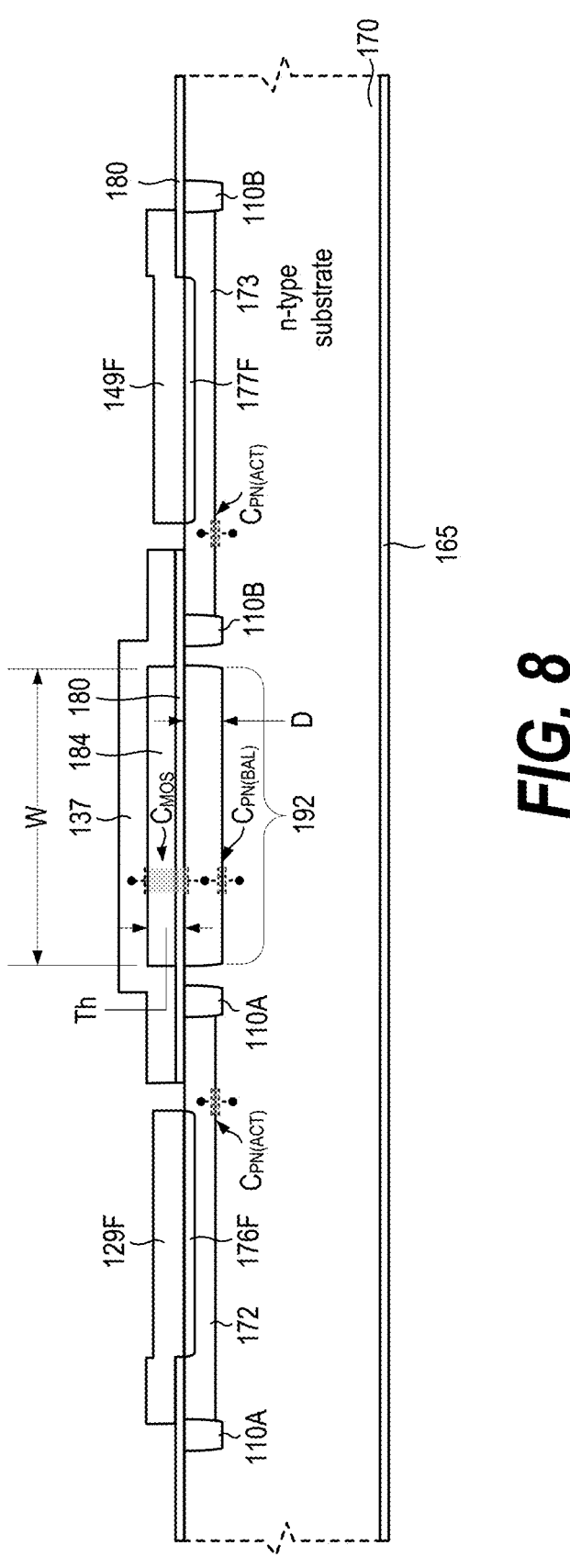
FIG. 8 illustrates the cross-sectional view designated C-C in FIG. 6 for another example embodiment described herein.

FIG. 8 illustrates the cross-sectional view designated C-C in FIG. 6 for another example embodiment described herein. As compared to the example shown in FIG. 7, the p-type region 192 is smaller than the p-type region 190. The p-type region 192 is positioned under the base interconnect manifold 137 but does not extend to, and is separate from, the guard rings 110A and 110B. The p-type region 192 extends under the base interconnect manifold 137 in an area of the substrate 170 that is outside of the guard rings 110A and 110n.

The junction capacitance $C_{PN(BAL)}$ between the n-type substrate 170 and the p-type region 192 can be less than that of the p-type region 190 shown in FIG. 7, due to the smaller size of the p-type region 192. The p-type region 192 extends, at least in part, under the base bond pad 132, under the base interconnect arm 134, and under the base interconnect arm 136. However, as compared to the p-type region 190 shown in FIGS. 6 and 7, the p-type region 192 extends under a smaller portion or range of the area under the base interconnect 130. The width "W" of the p-type region 192 can also be larger or smaller than that shown in FIG. 7. Additional p-type regions similar to the p-type region 192 can also be formed under the base interconnect 130 (see FIG. 2) and other base interconnects of the transistor 110.

The junction capacitance $C_{PN(BAL)}$ of the p-type region 192 is electrically connected in series with the $C_{MOS}$ capacitance and effectively reduces the contribution of the $C_{MOS}$ capacitance to the total $C_{CB}$ capacitance of the transistor 110. Consistent with the concepts described herein, the junction capacitance $C_{PN(BAL)}$ of the p-type region 192 contributes to a lower $C_{CB}$ for the transistor 110 and improved $f_T$, $f_{MAX}$, RF gain, frequency response, and gain characteristics of the transistor 110.

Compared with FIG. 7, the size of the p-type region 192 in FIG. 8 is smaller than the size of the p-type region 190 shown in FIG. 7. Thus, the junction capacitance $C_{PN(BAL)}$ associated with the p-type region 192 shown in FIG. 8 is less than that of the p-type region 190 shown in FIG. 7. Thus, one way to tailor the $C_{PN(BAL)}$ capacitance is to control the overall size of the p-type regions 190 or 192. If $C_{PN(BAL)}$ is tailored to be equivalent to $C_{MOS}$, the capacitance of $C_{MOS}$ can be reduced by as much as a factor of 2.

The $C_{PN(BAL)}$ capacitance of the p-type region 192 can also be varied in other ways (i.e., besides or in addition to its size), such as by selecting the concentration of the p-type dopant in the p-type region 192. The concentration of the p-type dopant in the p-type region 192 can be about $10^{19}$ cm$^{-3}$, for example, or within the range of $10^{16\text{-}20}$ cm$^{-3}$, and other concentrations can be relied upon. In one example, the concentration of the p-type dopant in the p-type region 192 is the same as (or not intentionally different than) the concentration of the p-type dopant in the guard rings 110A and 110B at about $10^{19}$ cm$^{-3}$. In other cases, the concentration of the p-type dopant in the p-type region 192 can be different than (i.e., intentionally greater or less than) the concentration of the p-type dopant in the guard rings 110A and 110B. For example, the concentration of the p-type dopant in the p-type region 192 can be about $10^{18}$ cm$^{-3}$ or lower and the concentration of the p-type dopant in the guard rings 110A and 110B can be about $10^{19}$ cm$^{-3}$ or higher. As another example, the concentration of the p-type dopant in the p-type region 192 can be about $10^{17}$ cm$^{-3}$ or lower and the concentration of the p-type dopant in the guard rings 110A and 110B can be about $10^{18}$ cm$^{-3}$ or higher. In other cases, the concentration of the p-type dopant in the p-type region 192 can be about $10^{20}$ cm$^{-3}$ and the concentration of the p-type dopant in the guard rings 110A and 110B can be about $10^{19}$ cm$^{-3}$.

The depth "D" of the p-type region 192 can also be varied based on the extent of activation or diffusion of the p-type dopant in the region using heat, as also described below. The depth "D" of the p-type region 192, as measured from the top to the bottom of the page in FIG. 8, is preferably as deep as or deeper than that of the guard rings 110A and 110B. In some cases, however, the depth "D" of the p-type region 192 can be less than that of the guard rings 110A and 110B. Example depths of the p-type region 192 (and the p-type region 190 shown in FIG. 7) include depths, measured from a top surface of the substrate 170 down into the substrate 170, to within 2-10 μm, although other depths can be relied upon. Variations in the doping density and depth "D" of the p-type region 192 are other ways to tailor the $C_{PN(BAL)}$ capacitance.

The dielectric layer 184 in FIG. 7 is similar to the dielectric layer 182 in FIG. 8 but is smaller in overall size and area. The dielectric layer 184 is formed under the base interconnect manifold 137, over the dielectric layer 180, and over the p-type region 192 in the example shown in FIG. 8. The area of the dielectric layer 184 coincides with that of the p-type region 192 outside of the active region of the transistor 110. That is, in the cross-sectional view shown, the width "W" of the dielectric layer 184 coincides with (i.e., is the same as) that of the p-type region 192. Additionally, from a top-down view, such as shown in FIG. 6, the periphery of the dielectric layer 184 also coincides with that of the p-type region 192. In other examples, the area of the dielectric layer 184 can be smaller or larger than that of the p-type region 192. The thickness "Th" of the dielectric layer 184 can also be selected to tailor the $C_{MOS}$ capacitance associated with the base interconnect 130, separately from the thickness of the dielectric layer 180.

The examples described above present a number of approaches to reduce the $C_{MOS}$ capacitance associated with metal interconnects that are electrically coupled to junctions of a transistor. The addition of a balancing semiconductor junction region having a junction capacitance $C_{PN(BAL)}$ that is in series with the $C_{MOS}$ capacitance effectively reduces the contribution of the $C_{MOS}$ capacitance to the total $C_{CB}$ capacitance of the transistor 110. Other examples include forming a semiconductor junction region under a first base conductive interconnect and omitting (i.e., not forming or including) the semiconductor junction region under a second base conductive interconnect. For example, one of the p-type regions 190 or 192 can be formed under the base interconnect 130 and not under the base interconnect 150. Alternatively, one of the p-type regions 190 or 192 can be formed under the base interconnect 150 and not under the base interconnect 130. Such a balancing semiconductor junction capacitance can also be formed under emitter interconnects or other interconnects of the transistor 110 in some cases. Additionally, while the transistor 110 is an "npn" type transistor, the concepts can be extended to and include "pnp" type transistors. In that case, the p-type dopants described in the examples above would be replaced by n-type dopants, and the n-type dopants described in the examples above would be replaced by p-type dopants.

If the capacitance of the balancing semiconductor junction, or $C_{PN(BAL)}$, is tailored to be equivalent to the $C_{MOS}$ capacitance, the $C_{MOS}$ capacitance can be effectively reduced by a factor of 2. It is not necessary, however, for the junction capacitance $C_{PN(BAL)}$ to be equivalent to the $C_{MOS}$ capacitance to achieve a reduction of the total $C_{CB}$ capacitance of the transistor 110. The junction capacitance $C_{PN}$ $_{(BAL)}$ can be tailored to be within 5-50% of the $C_{MOS}$ capacitance, including to within 5%, within 10%, within 15%, within 20%, within 25%, within 30%, within 35%, within 40%, within 45%, or within 50% in various examples. The total $C_{CB}$ capacitance of the transistor 110 will be reduced in all such cases and others.

Figure 9:
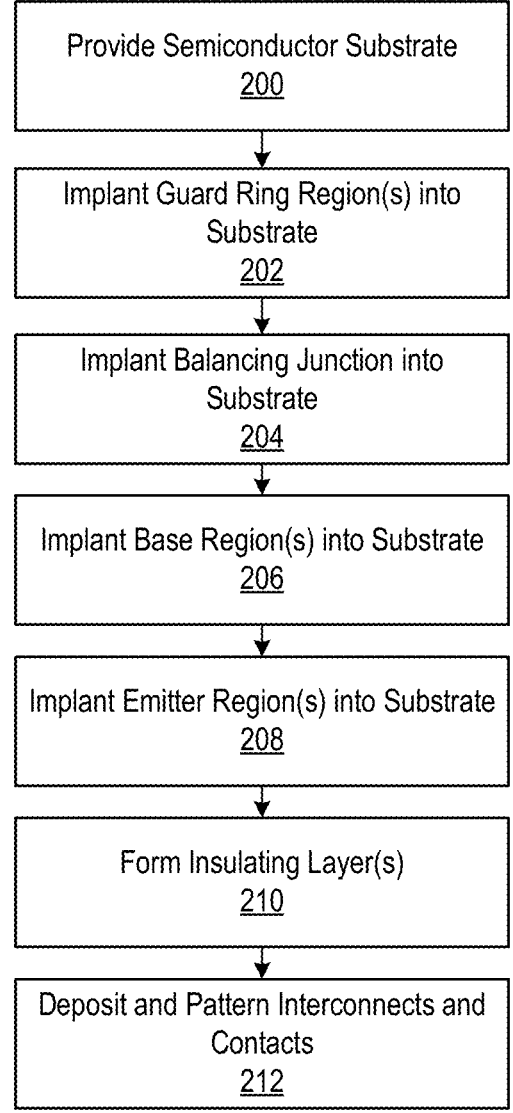
FIG. 9 illustrates a process for manufacturing a device with feedback capacitance reduction according to various embodiments described herein.

FIG. 9 illustrates a process for manufacturing a device with capacitance or feedback capacitance reduction. The process shown in FIG. 9 can be relied upon to form the transistor 110 shown above, among other transistors and active devices incorporating the concepts of capacitance reduction described herein. Thus, while FIG. 9 is described below with reference to the transistor 110 for context, the process can be relied upon to form other active devices. The process steps in FIG. 9 are shown as a representative example. FIG. 9 is not exhaustive, as additional process steps that are not shown or described can be used in the overall process. Additionally, in some cases, one or more of the process steps shown in FIG. 9 can be omitted, and the arrangement of the steps can be altered or rearranged as compared to that shown. For example, the process step of forming the insulating layer or layers can be performed before or after other steps as compared to that shown, more than once, and more than once at alternative positions in the overall flow.

At step 200, the process includes providing a semiconductor substrate, such as the semiconductor substrate 170 shown in FIGS. 7 and 8. The semiconductor substrate can be manufactured separately, sourced from a vendor, or some combination thereof. The substrate can be a single semiconductor substrate in one example. The substrate can also be a semiconductor substrate (e.g., a carrier or handle substrate) and one or more epitaxial layers of semiconductor materials (not individually shown) over the semiconductor substrate. The substrate and the epitaxial layers, where epitaxial layers are relied upon, can be embodied as Silicon, in one example, although other group III-IV semiconductor materials can be used. The substrate can be n-type doped with phosphorus, for example, to a concentration of within the range of $10^{15\text{-}16}$ $cm^{-3}$, although other concentrations can be relied upon. The substrate can include other n-type dopants in some cases, such as Arsenic or Antimony. Where the substrate is embodied as a carrier substrate and one or more epitaxial layers of semiconductor materials over the carrier substrate, the carrier substrate can be n-type doped to a concentration of about $10^{19}$ $cm^{-3}$, for example, or within a range of between $10^{17\text{-}19}$ $cm^{-3}$, and the epitaxial layers can be doped to other concentrations within the range of $10^{14\text{-}16}$ $cm^{-3}$.

At step 202, the process includes implanting one or more guard ring regions into the substrate from step 200. For example, this can include the application and photolithographic patterning of a thin film over the substrate 170, as well as the selective etching or removal of the film to define the size, position, and shape of the guard ring regions being formed in the substrate 170. The areas within the guard rings will ultimately form the active regions of the transistor 110. The process can also include the implantation of a p-type dopant into the top surface of the substrate 170 within the guard ring regions, as the guard ring regions are defined.

These process steps can be relied upon to form the p-type guard rings 110A and 110B, among others, in the substrate 107 shown in FIGS. 7 and 8. Step 202 can also include the activation and diffusion of the p-type dopant, after implantation, using heat. The p-type guard rings 110A and 110B, among others, can be formed by the implantation of boron, for example, although gallium or other p-type dopants can be relied upon. The concentration of the p-type dopant in the guard ring 110A can be about $10^{19}$ $cm^{-3}$, for example, or within the range of $10^{18\text{-}20}$ $cm^{-3}$, and other concentrations can be relied upon.

In some cases, step 202 and the related guard ring regions and guard rings can be omitted from the process shown in FIG. 9. Additionally, the guard rings described herein, such as the guard rings 110A-110D, may be omitted or not included in some embodiments. In that case, the active region of the transistor 110 would be defined by the area of the p-type diffusion region 172.

At step 204, the process includes implanting one or more balancing junction regions into the substrate. This can include the application and photolithographic patterning of a thin film over the substrate 170, as well as the selective etching or removal of the film to define the size, position, and shape of the balancing junction regions being implanted and formed in the substrate 170. In one example, the balancing junction regions defined in step 204 are exclusive of (i.e., non-overlapping with) and outside of the guard ring regions defined in step 202, which is consistent with the example shown in FIG. 8. In another example, the balancing junction regions defined in step 204 can overlap in part with or abut (e.g., share an edge or side with) the guard ring regions defined in step 202, although those regions are defined and implanted separately in steps 202 and 204. This approach can permit different dopant densities and diffusion depths among the guard ring regions and the balancing junction regions. In another example described below, steps 202 and 204 can be combined, in which case the balancing junction and guard ring regions can be defined at the same time, which is consistent with the example shown in FIG. 7.

At step 204, the process also includes the implantation of a p-type dopant into the top surface of the substrate within the balancing junction regions, as those regions are defined. Step 204 can be relied upon to form the p-type region 192 shown in FIG. 8, among others in the substrate 170. Step 204 can also include the activation and diffusion of the p-type dopant, after implantation, using heat. The p-type region 192 can be formed by the implantation of boron, for example, although gallium or other p-type dopants can be relied upon. The concentration of the p-type dopant in the p-type region 192 can be about $10^{19}$ $cm^{-3}$, for example, or within the range of $10^{16\text{-}20}$ $cm^{-3}$, and other concentrations can be relied upon. In one example, the concentration of the p-type dopant in the p-type region 192 is the same as (or not intentionally different than) the concentration of the p-type dopant in the guard rings 110A and 110B at about $10^{19}$ $cm^{-3}$. In other cases, the concentration of the p-type dopant in the p-type region 192 can be different than (i.e., intentionally greater or less than) the concentration of the p-type dopant in the guard rings 110A and 110B.

The depth "D" of the p-type region 192 (see FIG. 8) can be set based on the extent of the activation or diffusion of the p-type dopant in the p-type region 192 using heat. The depth "D" of the p-type region 192, as measured from the top to the bottom of the page in FIG. 8, is preferably as deep as or deeper than that of the guard rings 110A and 110B. In some cases, however, the depth "D" of the p-type region 192 can be less than that of the guard rings 110A and 110B. Example depths of the p-type region 192 include depths, measured from a top surface of the substrate 170 down into the substrate 170, to within 2-10 μm, although other depths can be relied upon.

Steps 204 and 206 can be performed separately, as set forth above, but steps 204 and 206 can also be combined (and performed in fewer steps) in some cases. The result of the combination of steps 202 and 204 is the definition of the guard ring and balancing junction regions at the same time, followed by a single implantation, activation, and diffusion process. The guard ring and balancing junction regions can be separated from each other in this case, consistent with the example shown in FIG. 8, or overlapping with each other, consistent with the example shown in FIG. 7. In any case, although this combined approach relies upon fewer process steps overall, it does not permit different dopant densities or diffusion depths among the guard ring regions and the balancing junction regions.

At step 206, the process includes implanting one or more base regions into the substrate. For example, this can include the application and photolithographic patterning of a thin film over the substrate 170, as well as the selective etching or removal of the film to define the size, position, and shape of the base region or regions being formed in the substrate 170. The base regions define the active regions of the transistor 110. The process can also include the implantation of a p-type dopant into the top surface of the substrate 170 within the base regions. Step 206 can be relied upon to form the p-type region 172 shown in FIGS. 4, 7, and 8.

At step 208, the process includes implanting one or more emitter regions into the substrate. For example, this can include the application and photolithographic patterning of a thin film over the substrate 170, as well as the selective etching or removal of the film to define the size, position, and shape of the emitter region or regions being formed in the substrate 170. The process can also include the implantation of an n-type dopant into the top surface of the substrate 170 within the emitter regions. Step 208 can be relied upon to form the n-type regions 176A, 176B, 176F, and 177F shown in FIGS. 4, 7, and 8.

At step 210, the process includes forming one or more insulating layers, such as insulating dielectric layers, over a top surface of the substrate. As examples, step 210 can include forming one or more of the dielectric layer 180 shown in FIGS. 4, 6, and 8, the dielectric layer 182 shown in FIG. 7, or the dielectric layer 184 shown in FIG. 8 over the top surface of the substrate 170. The insulating layers can be formed by the local oxidation of the top surface of the substrate 170, or regions of it, to form $SiO_2$ layers or $SiO_2$ regions. The insulating layers can also be formed by depositing one or more layers of insulating materials over the substrate 170 or other suitable techniques. Notably, step 210 can include steps to form the dielectric layer 180 separately from the dielectric layer 182 or the dielectric layer 184. In that way, the dielectric layers 182 and 184 can be formed to have a different thickness than the dielectric layer 180, for the reasons described above. In some cases, the dielectric layer 180 can be formed at step 210, without forming either of the dielectric layers 182 and 184.

At step 212, the process includes depositing and patterning conductive interconnects and contacts over the substrate. Step 212 can be relied upon to form the interconnects 120, 130, 140, and 150 described herein, as examples, as well as the emitter contact fingers and other conductive metal features of the transistor 110. As one example, step 212 can include applying a photoresist layer or film over the substrate 170, patterning the photoresist layer using photolithography to define the boundaries of the interconnects 120, 130, 140, and 150, and selectively removing the photoresist layer in the regions. The process can also include depositing one or more layers of metal over the patterned photoresist layer. The process can also include lifting off or removing the metal deposited outside of the regions for the interconnects 120, 130, 140, and 150, by stripping the remaining photoresist and metal outside of the regions (e.g., using lift-off) or other techniques.

The process in FIG. 9 is described in connection with the transistor 110, which is an "npn" type transistor, but a similar process can be performed to manufacture "pnp" type transistors. In that case, the p-type dopants described in the examples above would be replaced by n-type dopants, and the n-type dopants described in the examples above would be replaced by p-type dopants.

The active devices and transistors described herein can be formed using a number of different semiconductor materials and semiconductor manufacturing processes. Example semiconductor materials include the group IV elemental semiconductor materials, including Silicon (Si) and Germanium (Ge), compounds thereof, and the group III elemental semiconductor materials, including Aluminum (Al), Gallium (Ga), and Indium (In), and compounds thereof. Semiconductor transistor amplifiers can be constructed from group III-V direct bandgap semiconductor technologies, in certain cases, as the higher bandgaps and electron mobility provided by those devices can lead to higher electron velocity and breakdown voltages, among other benefits.

The features, structures, or characteristics described above may be combined in one or more embodiments in any suitable manner, and the features discussed in the various embodiments are interchangeable in many cases. In the foregoing description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although relative terms such as "over," "under," "upper," "lower," "top," "bottom," "right," and "left" may be used to describe the relative spatial relationships of certain structural features, these terms are used for convenience only, as a direction in the examples. When a structure or feature is described as being "over" (or formed over) another structure or feature, the structure can be positioned over the other structure, with or without other structures or features intervening between them. When two components are described as being "connected to" or "coupled to" each other, the components can be electrically coupled to each other, with or without other components being electrically coupled and intervening between them. When two components are described as being "directly connected to" or "directly coupled to" each other, the components can be electrically coupled to each other, without other components being electrically coupled between them.

Terms such as "a," "an," "the," and "said" are used to indicate the presence of at least one element or component (e.g., one or, alternatively, more than one), unless particularly identified as one and only one (e.g., single or singular one). The terms "comprise," "include," "have," "contain," and their variants are open ended and may include or encompass additional elements, components, etc., in addition to the listed elements, components, etc., unless otherwise specified. The terms "first," "second," etc. are used only as distinguishing or separating labels, rather than a limitation of a number of the components, unless particularly used as a numerical quantifier.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A transistor, comprising:
a substrate;
an active region of the transistor in the substrate, the active region comprising a base contact over the active region;
a dielectric layer over a top surface of the substrate; and
an interconnect region, the interconnect region comprising:
a conductive interconnect extending over the dielectric layer and being electrically coupled with the base contact; and
a semiconductor junction region extending under the conductive interconnect in an area of the substrate outside of the active region.

2. The transistor of claim 1, wherein:
the conductive interconnect, the dielectric layer, and the substrate comprise a first capacitance;
the semiconductor junction region under the conductive interconnect comprises a second capacitance; and
the first capacitance is electrically coupled in series with the second capacitance.

3. The transistor of claim 1, wherein:
the conductive interconnect, the dielectric layer, and the substrate comprise a first capacitance;
the semiconductor junction region under the conductive interconnect comprises a second capacitance; and
the first capacitance is within 50% of the second capacitance.

4. The transistor of claim 1, wherein:
the conductive interconnect comprises a bond pad and an interconnect arm; and
the semiconductor junction region extends under the bond pad and the interconnect arm.

5. The transistor of claim 1, further comprising a second dielectric layer under the conductive interconnect in an area of the substrate outside the active region.

6. The transistor of claim 5, wherein a thickness of the second dielectric layer is different than a thickness of the dielectric layer.

7. The transistor of claim 5, wherein:
the conductive interconnect, the dielectric layer, the second dielectric layer, and the substrate comprise a first capacitance;
the semiconductor junction region under the conductive interconnect comprises a second capacitance; and
the first capacitance is electrically coupled in series with the second capacitance.

8. The transistor of claim 1, further comprising a guard ring around the active region, wherein the guard ring comprises the semiconductor junction region and extends under the conductive interconnect in an area of the substrate outside of the active region.

9. The transistor of claim 1, further comprising a guard ring around the active region, wherein the semiconductor junction region extends under the conductive interconnect in an area of the substrate outside of the guard ring and the active region.

10. The transistor of claim 9, wherein the semiconductor junction region is separated from the guard ring.

11. The transistor of claim 1, further comprising:
a second active region of the transistor in the substrate, the second active region comprising a second base contact over the second active region;
a second conductive interconnect extending over the dielectric layer and being electrically coupled with the second base contact; and
a second semiconductor junction region extending under the second conductive interconnect in an area of the substrate outside of the active region and outside of the second active region.

12. The transistor of claim 1, wherein:
the active region further comprises an emitter contact over the active region on a top side of the substrate; and
a collector contact over a bottom side of the substrate.

13. The transistor of claim 1, wherein:
the substrate comprises an n-type substrate; and
the semiconductor junction region comprises a p-type dopant.

14. The transistor of claim 1, wherein:
the substrate comprises an p-type substrate; and
the semiconductor junction region comprises a n-type dopant.

15. A transistor, comprising:
a substrate;

an active region of the transistor in the substrate, the active region comprising a guard ring and a base contact over the active region;

a dielectric layer over a top surface of the substrate; and an interconnect region outside of the active region, the interconnect region comprising:

a conductive interconnect extending over the dielectric layer and being electrically coupled with the base contact; and a semiconductor junction region extending under the conductive interconnect.

16. The transistor of claim 15, wherein:

the conductive interconnect, the dielectric layer, and the substrate comprise a first capacitance;

the semiconductor junction region under the conductive interconnect comprises a second capacitance; and the first capacitance is electrically coupled in series with the second capacitance.

17. The transistor of claim 15, wherein:

the conductive interconnect comprises a bond pad and an interconnect arm; and the semiconductor junction region extends under the bond pad and the interconnect arm.

18. The transistor of claim 15, further comprising a second dielectric layer under the conductive interconnect in an area of the substrate outside the active region.

19. The transistor of claim 15, wherein the semiconductor junction region is separated from the guard ring.

20. The transistor of claim 15, wherein the semiconductor junction region is an extension of the guard ring.

\* \* \* \* \*